US008077881B2

(12) United States Patent
Takata et al.

(10) Patent No.: US 8,077,881 B2
(45) Date of Patent: Dec. 13, 2011

(54) SOUND DEVICE

(75) Inventors: Kosuke Takata, Hamamatsu (JP); Masayuki Takagi, Hamamatsu (JP); Masato Ueno, Hamamatsu (JP)

(73) Assignee: Roland Corporation, Nakagawa, Hosoe-cho, Shizuoka-ken (JP)

( * ) Notice: Subject to any disclaimer, the term of this patent is extended or adjusted under 35 U.S.C. 154(b) by 1366 days.

(21) Appl. No.: 11/654,378

(22) Filed: Jan. 17, 2007

(65) Prior Publication Data

US 2008/0170722 A1 Jul. 17, 2008

(51) Int. Cl.
*H03G 5/00* (2006.01)
*H04R 5/00* (2006.01)
*H04R 29/00* (2006.01)

(52) U.S. Cl. .................. 381/99; 381/98; 381/1; 381/17; 381/59; 381/18

(58) Field of Classification Search .................... 381/98, 381/99, 87, 386, 1, 17–19, 59, 80
See application file for complete search history.

(56) References Cited

U.S. PATENT DOCUMENTS 3,927,279 A * 12/1975 Nakamura et al. ............ 381/320
6,741,712 B2 * 5/2004 Bisgaard ....................... 381/312

* cited by examiner

*Primary Examiner* — Devona Faulk
(74) *Attorney, Agent, or Firm* — Foley & Lardner

(57) ABSTRACT

A sound device is provided with an input terminal for electronic signal input; a low pass filter adapted to filter electronic signals input to the input terminal and to output low frequency range electronic signals, a switch arrangement adapted to switch between full range mode and sub woofer mode, a power amplifier adapted to amplify (1) electronic signals input from the input terminal when the switch arrangement selects full range mode, and (2) electronic signals output from the low pass filter when the switch arrangement selects sub woofer mode, and a speaker adapted to be operated by electronic signals amplified by the power amplifier.

15 Claims, 4 Drawing Sheets

SOUND DEVICE

BACKGROUND

The present invention relates generally to the field of sound devices.

Powered sub woofer device has been traditionally known that it would (1) filter electronic signals that were input to it with low pass filter, (2) amplify low-frequency range electronic signals with power amplifier, and (3) operate its speaker. U.S. Patent Publication No. 2006/0005694 has published the technology that would (1) separate electronic signals that were input from one single input terminal into high frequency range and low frequency range with crossover filter, (2) operate tweeter with high frequency range electronic signals that were output from there, (3) amplify low frequency range electronic signals, and (4) operate its woofer.

There, however, was an issue that the device had to prepare both powered full range speaker and powered sub woofer and differentiate its use, for the following reasons:

1) Powered sub woofer could only play low frequency range;
2) Powered full range speaker could only play full range; and
3) Desired frequency ranges for playback were different depending on surrounding environment and conditions.

SUMMARY OF THE DISCLOSURE

Embodiments of the present invention are intended to provide a sound device that can be utilized as powered full range speaker or powered sub woofer by switching between full range mode and sub woofer mode with switch arrangement, in order to solve the issue indicated above.

An embodiment of the invention is related to a sound device with the following features: 1) it has switch arrangement that can switch from full range mode and sub woofer mode; and 2) with that switch arrangement, it can be utilized as powered full range speaker or powered sub woofer.

In one aspect, the invention is provided with an input terminal for electronic signal input; a low pass filter adapted to filter electronic signals input to the input terminal and to output low frequency range electronic signals, a switch arrangement adapted to switch between full range mode and sub woofer mode, a power amplifier adapted to amplify (1) electronic signals input from the input terminal when the switch arrangement selects full range mode, and (2) electronic signals output from the low pass filter when the switch arrangement selects sub woofer mode, and a speaker adapted to be operated by electronic signals amplified by the power amplifier.

The effect of embodiments of the invention is that one single sound device can be utilized as powered full range speaker or powered sub woofer by switching between full range mode and sub woofer mode with a switch arrangement, in order to solve the issue indicated above.

In a particular embodiment, the sound device includes a frequency configuration arrangement adapted to configure cut-off frequency of the low pass filter. Thus, the device can control sound effect that is generated from its speaker.

In another embodiment, the sound device includes a through output terminal adapted to output electronic signals input on the input terminal to the external area. Thus, the device can output larger sound pressure by adding sound device on through output terminal.

In one embodiment, the sound device includes a line output terminal adapted to output (1) electronic signals input on the input terminal over the entire frequency range when the switch arrangement selects full range mode, and (2) electronic signals filtered through the low pass filter when the switch arrangement selects sub woofer mode. Thus, the sound device can change sound effect of the subsequent sound devices all at the same time by changing modes due to the fact that electronic signals with sound effect information of each mode are output.

In another aspect of the invention, a sound device includes an input terminal for electronic signal input; a low pass filter adapted to filter electronic signals input to the input terminal and to output low frequency range electronic signals; a crossover filter adapted to filter electronic signals input on the input terminal, and to output electronic signals with both low frequency range and high frequency range respectively; a switch arrangement adapted to select between full range mode and sub woofer mode; a primary power amplifier adapted to amplify (1) low frequency range electronic signals output from the crossover filter when the switch arrangement selects full range mode, and (2) electronic signals output from the low pass filter when the switch arrangement selects sub woofer mode; a secondary power amplifier adapted to amplify high frequency range electronic signals output from the crossover filter when the switch arrangement selects full range mode; a woofer adapted to be operated by electronic signals amplified by the primary power amplifier, and a tweeter adapted to be operated by electronic signals amplified by the secondary power amplifier.

Thus, one single sound device can be utilized as a powered full range speaker or powered sub woofer by switching between full range mode and sub woofer mode with switch arrangement.

In one embodiment, the sound device includes a level configuration arrangement adapted to configure signal level of high frequency range electronic signals output from the crossover filter. Thus, it can control sound effect by changing levels of electronic signals that are generated from a tweeter.

In one embodiment, the sound device includes a frequency configuration arrangement adapted to configure a cut-off frequency for the low pass filter. Thus, the device may control sound effect by changing frequency range of sound that is generated from a woofer.

In an embodiment, the sound device may also include a primary sound quality control arrangement adapted to control electronic signals output from the low pass filter and to change sound quality properties; a secondary sound quality control arrangement adapted to control electronic signals output from the crossover filter and to change sound quality properties.

Thus, the device can control the most suitable sound quality property for each mode. The secondary sound quality control arrangement controls sound quality property of low frequency range electronic signals output from crossover filter when the switch arrangement selects full range mode, and the primary sound quality control arrangement controls sound quality property of electronic signals output from the low pass filter when the switch arrangement selects sub woofer mode.

In one embodiment, the sound device includes a control terminal adapted to conduct the configuration operation of (1) the level configuration when the switch arrangement selects full range mode, and (2) the frequency configuration when the switch arrangement selects sub woofer mode. Thus, quantity of control terminals and, consequently, manufacturing costs for the sound device can be reduced.

In an embodiment, the sound device may also include an alert arrangement adapted to alert a particular mode that the switch arrangement selects. Thus, a user can instantly identify which mode the user has selected.

In one embodiment, the alert arrangement includes an LED. Thus, a user can instantly identify which mode the user has selected regardless of lighting condition of where the sound device is positioned.

In one embodiment, the sound device includes a power shut-off arrangement adapted to cut off a power supply for the secondary power amplifier when the switch arrangement selects sub woofer mode. Thus, energy consumption of the sound device can be reduced, as it can reduce unnecessary energy consumption for the unused secondary power amplifier.

In one embodiment, the sound device amplifies electronic signals output from the secondary power amplifier and operates the woofer along with the primary power amplifier when the switch arrangement selects sub woofer mode. Thus, the sound device can generate sound with stronger sound pressure from the woofer.

In one embodiment, the sound device operates the woofer based on BTL operation. Thus, the device can generate sound with stronger sound pressure from the woofer.

In one embodiment, the sound device includes a through output terminal adapted to output electronic signals input on the input terminal to an external area. Thus, the device can generate sound with stronger sound pressure.

In one embodiment, the sound device includes a line output terminal adapted to output (1) electronic signals input on the input terminal over the entire frequency range when the switch arrangement selects full range mode, and (2) electronic signals filtered through the low pass filter when the switch arrangement selects sub woofer mode. Thus, the sound device can change sound effect of the subsequent sound devices that are connected with line output all at the same time by changing modes due to the fact that electronic signals with sound effect information of each mode are output from the line output terminal.

DETAILED DESCRIPTION OF THE PREFERRED EMBODIMENTS

Figure 1:
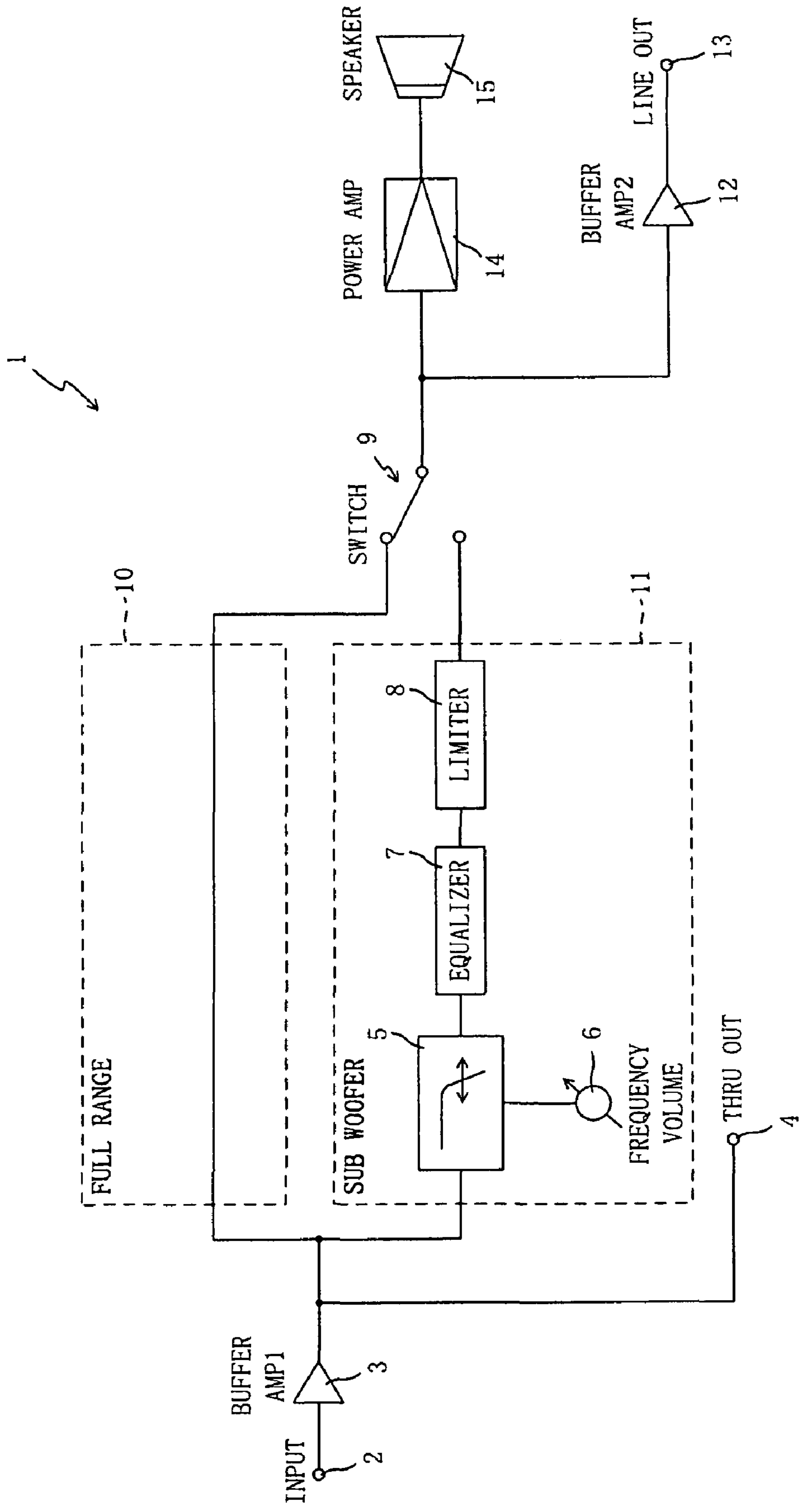
FIG. 1 is a block diagram illustrating an electrical configuration of a sound device according to an embodiment of the invention.

Referring to FIG. 1, a block diagram illustrates an electrical configuration of a sound device 1 according to an embodiment of the invention. The sound device 1 comprises the following components; an input 2, a primary buffer amplifier 3, a through output 4, a low pass filter 5, a cut-off frequency configuration knob (or, cut-off frequency level controller) 6, an equalizer 7, a limiter 8, a switching arrangement comprising a mode switch 9, a secondary buffer amplifier 12, a line out 13, a power amplifier 14, and a speaker 15.

The input 2 is mainly connected with line outputs of an electronic guitar, electronic bass, electronic keyboard, electronic piano, and so forth, through connecting cords. Electronic signals that were input on the input 2 will be output from the through output 4 via the primary buffer amplifier 3. The through output 4 may be connected with additional speakers through connecting cords. The device can generate sound with larger sound pressure.

The output from the primary buffer amplifier 3 is input on the low pass filter 5 and the mode switch 9. The low pass filter 5 configures its frequency range with the cut-off frequency level controller 6, and outputs only low frequency range electronic signals on the equalizer 7. The device can control sound effect by changing frequency range and subsequent frequency range of sound that is generated from the speaker 15. The equalizer 7 modifies frequency property, and the limiter 8 controls electronic signals within a certain level, and inputs on the mode switch 9.

Among electrical configuration from the primary buffer amplifier 3 to the mode switch 9, a block that generates low frequency range electronic signals refers to a sub woofer mode circuit 11, and another block that processes no electronic signals refers to the full range mode circuit 10. One end of the mode switch 9 is connected with electronic signals that are output from the full range mode circuit 10, and the other end is connected with electronic signals that are output from the sub woofer mode circuit 11.

The output of the mode that is selected by the mode switch 9 is input on the secondary buffer amplifier 12 and the power amplifier 14. The sound device 1 can be utilized as powered sub woofer when this mode switch 9 selects the sub woofer mode, and as a powered full range speaker when it selects the full range mode.

The secondary buffer amplifier 12 is connected with the line out 13 and functions as an amplifier that prevents the sound device 1 from getting electrical impact from external sound devices when the line out 13 is connected with an external sound device. The line out 13 may be connected with an extension speaker and a power amplifier, and so forth, through connecting cords. As the line out 13 outputs electronic signals with sound effect of each mode, the sound device 1 can change sound effect of the subsequent sound devices that are connected with the line out all at the same time by changing modes.

The power amplifier 14 amplifies electronic signals that are input from the mode switch 9, and operates the speaker 15.

Figure 2:
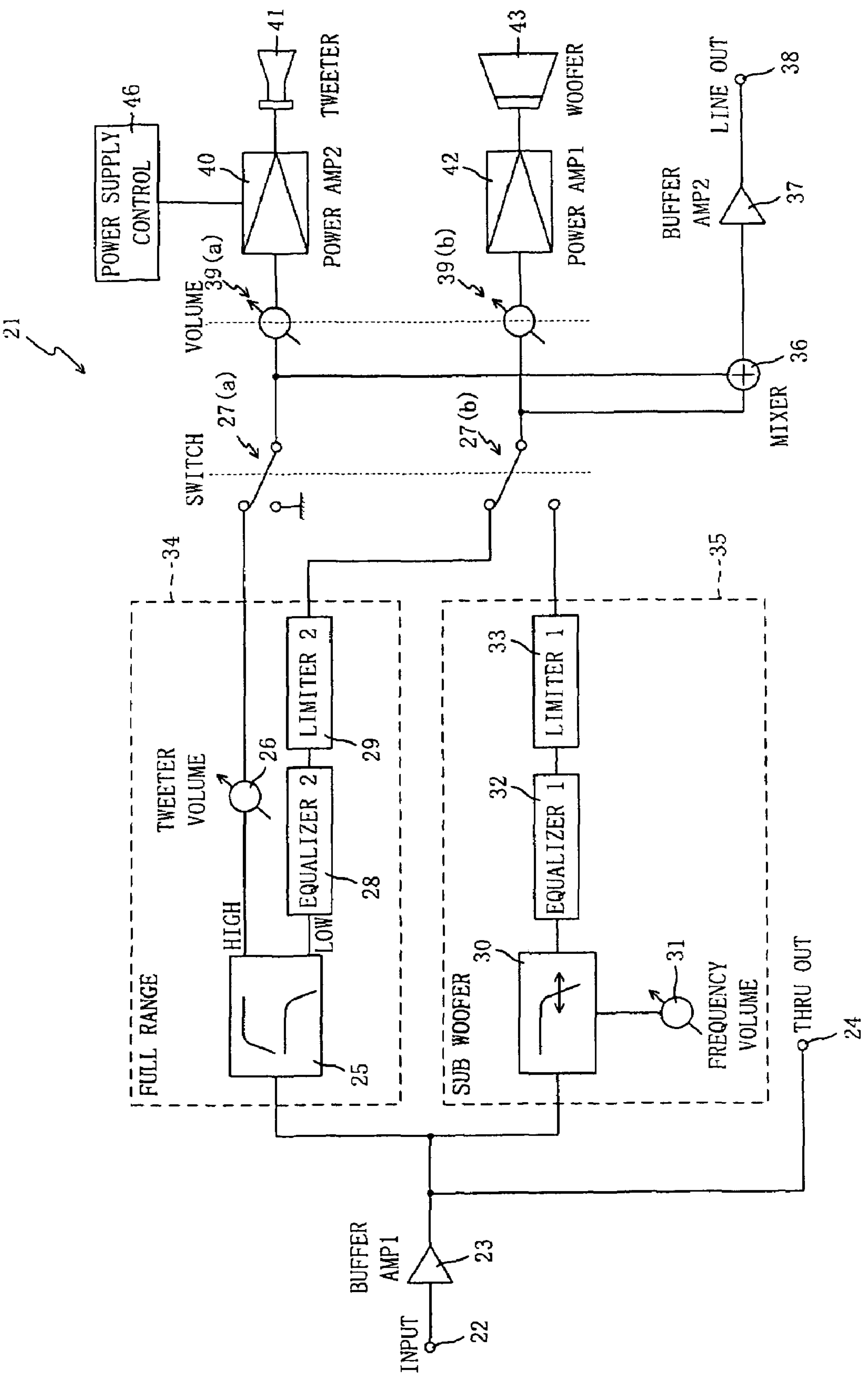
FIG. 2 is a block diagram illustrating an electrical configuration of a sound device according to another embodiment of the invention.

With reference to FIG. 2, another embodiment of a sound device will now be described. In the sound device 1 of FIG. 1, electronic signals are amplified with a single power amplifier 14, and sound is generated with a single speaker 15. In the embodiment illustrated in FIG. 2, input electronic signals are separated into low frequency range electronic signals and high frequency range electronic signals when full range mode is selected. The low frequency range electronic signals generate sound with a woofer 43, and the high frequency range electronic signals generate sound with a tweeter 41.

FIG. 2 is a block diagram illustrating the electrical configuration of a sound device 21 according to an embodiment of the invention. The sound device 21 comprises an input 22, a primary buffer amplifier 23, a through out 24, a low pass filter 30, a cut-off frequency configuration knob (or cut-off frequency level controller) 31, a primary equalizer 32, a primary limiter 33, a crossover filter 25, a tweeter volume configuration knob (or tweeter level controller) 26, a mode switch 27, a secondary equalizer 28, a secondary limiter 29, a signal mixer 36, a secondary buffer amplifier 37, a line out 38, level controller 39, a primary power amplifier 42, a woofer 43, a secondary power amplifier 40, a tweeter 41, and a power supply control 46.

Among the electrical configuration from the primary buffer amp 23 to the mode switch 27, a block that generates high frequency range electronic signals and low frequency range electronic signals refers to a full range mode circuit 34, and the other block that generates only low frequency range electronic signals refer to a sub woofer mode circuit 35.

The input 22 is connected with a line output of sound device through connecting cords, just like the sound device 1 illustrated in FIG. 1. Electronic signals that are input on the input 22 are output from the through out 24 via the primary buffer amplifier 23. The through out 24 may be connected with such input terminals as effecter and additional speaker through connecting cords The device can generate stronger sound pressure by connecting external sound device as additional devices. The output from the primary buffer amplifier 23 is input on the low pass filter 30 and the crossover filter 25.

Electronic signals that are input on the low pass filter 30 will output only low frequency range, and will be input on the primary equalizer 32. The frequency range of electronic signals that are output from the low pass filter 30 is configured by the cut-off frequency level knob 31. This cut-off frequency configuration knob 31 is attached with a variable resistor axis and can control frequency level by turning up or down the resistance. The frequency range of the sound that is generated from the woofer 43 will vary by changing the frequency level. Thus, it can control acoustic effects.

The primary equalizer 32 corrects frequency property of electronic signal input. The primary limiter 33 limits signal level of the corrected signals below a certain level, and then the signals are input on the mode switch 27(*b*). This switch 27 is equipped with two switch points, 27(*a*) and 27(*b*). These points will switch themselves at the same time, when the switch is turned. It enables two independent electrical circuits to be switched simultaneously.

On the other hand, the crossover filter 25 separates electronic signal input into high frequency range and low frequency range. Separated high frequency range electronic signals are input on the tweeter level controller 26, and low frequency range electronic signals are input on the secondary equalizer 28. The tweeter level controller 26 controls electronic signal level that is input on the mode switch 27(*a*). One end of the input-section of the mode switch 27(*a*) is connected with high frequency range electronic signals that are output from the full range mode, and the other end is connected with ground (GND). The mode switch 27(*a*) inputs the selected outputs on the signal mixer 36 and the volume controller 39(*a*). This volume controller 39(*a*) is attached with a variable resistor axis and controls signal level by changing resistance of the variable resistor. When signal level is varied, the level of sound signal that is generated from tweeter 41 is changed accordingly, and it enables the device to control acoustic effects.

The secondary equalizer 28 corrects frequency property of electronic signal input. The secondary limiter 29 limits the signal level of the corrected signals below a certain level, and then the signals are input on the mode switch 27(*b*). These points can be switched at the same time, when the switch is turned. It enables two independent electrical circuits to be switched simultaneously.

One end of the input section of the mode switch 27(*b*) is connected with low frequency range electronic signals that are output from the full range mode circuit 34, and the other end is connected with low frequency range electronic signals that are output from the sub woofer mode circuit 35. The mode switch 27(*b*) inputs the selected outputs on the signal mixer 36 and the volume controller 39(*b*). Thus, the mode switch 27 switches two different electronic signals from either the sub woofer mode circuit 35 or the full range mode circuit 34.

When the mode switch 27 selects the sub woofer mode, low frequency range electronic signals that are output from the sub woofer mode circuit 35 pass the mode switch 27(*b*) and are input on the signal mixer 36 and the volume controller 39(*b*). The mode switch 27(*a*) is also connected with GND; thus, there will be no input signals on the signal mixer 36 and the volume controller 39(*a*). The power supply control 46 is a circuit that controls power supply or shut-off for the secondary power amplifier 40 when the sub woofer mode is selected. When the secondary power amplifier 40 is not in use, the power supply control 46 may cut power supply for the secondary power amplifier 40. It enables the sound device 21 to reduce energy consumption.

On the other hand, when the mode switch 27 selects full range mode, high frequency range electronic signals that are output from the full range mode circuit 34 pass the mode switch 27(*a*) and are input on the signal mixer 36 and the volume controller 39(*a*). Low frequency range electronic signals also pass the mode switch 27(*b*) and are input on the signal mixer 36 and the volume controller 39(*b*).

The sound device 21 can be utilized as a powered sub woofer when the mode switch 27 is switched to select the sub woofer mode, as well as a powered full range speaker when the full range mode is selected. The equalizer and limiter are provided for each mode. Sound quality property will be controlled by the primary equalizer 32 and the primary limiter 33 during the sub woofer mode and by the secondary equalizer 28 and the secondary limiter 28 during full range mode. It enables the device to control suitable sound quality property for each mode.

The signal mixer 36 mixes two signal inputs and inputs the mixed signals on the secondary buffer amplifier 37. The secondary buffer amplifier 37 is connected with the line out 38 and functions to prevent the sound device 21 from getting electrical impact from external sound devices when the line out 38 is connected with external sound devices. The line out 38 may be connected with such input terminals as an extension speaker and a power amplifier through connecting cords. The line out 38 outputs electronic signals attached with acoustic effect of each mode. It enables the device to change acoustic effect of the subsequent sound devices attached to the line out 38 by changing the modes.

The volume controller 39 is attached with two independent variable resistors (39*a* and 39*b*) along with one turning resistor axis, and the resistance of two different resistors is changed when one axis is turned. It controls sound volume by changing resistance of the resistors. Electronic signals that are output from the volume controller 39(*b*) are amplified by the primary power amplifier 42 and operate the woofer 43. Electronic signals that are output from the volume controller 39(*a*) are also amplified by the secondary power amplifier 40 and operate the tweeter 41.

Figure 3:
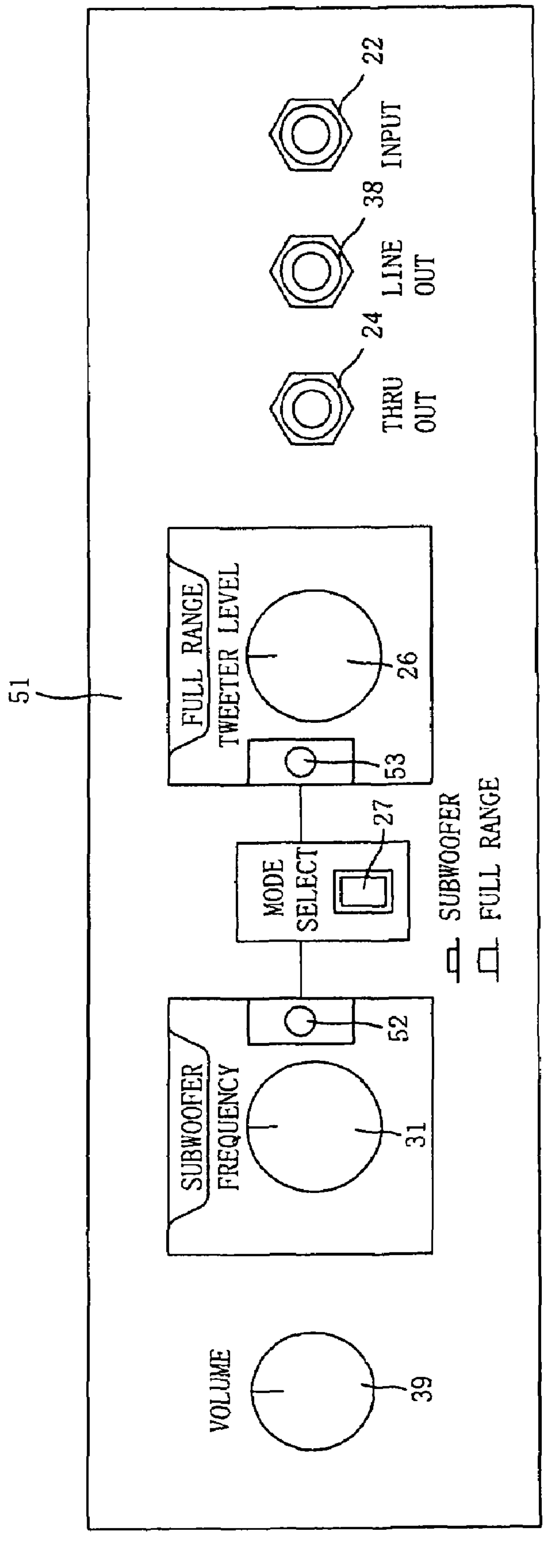
FIG. 3 illustrates a control panel according to an embodiment of the invention.

An embodiment of a control panel will now be described with reference to FIG. 3. A control panel 51 comprises a volume controller 39, a cut-off frequency configuration knob (or cut-off frequency level controller) 31, a sub woofer mode indicator 52, a mode switch 27, a full range mode indicator 53, a tweeter volume configuration knob (or tweeter level controller) 26, a through out 24, a line out 38, and an input 22.

The volume controller 39, the cut-off frequency level controller 31 and the tweeter level controller 26 each include turning a variable resistor. Resistance varies when the axis is turned, and the value on each controller 26, 31, 39 is positioned to match with resistance.

The mode switch 27 consists of an alternate type push button. Modes change alternately every time the button is pushed. When the button is pushed during sub woofer mode, it changes the mode to full range mode, and when the button is pushed during full range mode, it changes the mode to sub woofer mode.

The sub woofer mode indicator 52 comprises a red light-emitting diode (LED), and the full range mode indicator 53 comprises a green LED. When the sound device 21 is used under sub woofer mode, the sub woofer mode indicator 52 is lit, and when it is used under full range mode, the full range mode indicator 53 is lit. These two indicators enable a user to instantly identify which mode is currently selected. Since either one of the LED is lit, the user can instantly identify which mode is selected.

The input 22 comprises an input jack and can be attached with detachable plugs of cable that are connected with instruments, sound device, etc. The through out 24 and the line out 38 also comprise an output jack and can be attached with detachable plugs of connecting cables. One end can be inserted to the output jack, and the other end can be inserted to an input terminal of such sound device as effecter or additional speaker, for example.

Another embodiment of a sound device will now be described with reference to FIG. 4. In the sound device 21 of FIG. 2, the secondary power amplifier 40 is not used during sub woofer mode. In the sound device 61 illustrated in FIG. 4, the secondary power amplifier 40 is used during sub woofer mode in order to amplify electronic signals that are output from the sub woofer mode circuit 35 in opposite phase. The primary power amp 42 and the secondary power amplifier 40 are co-activated to operate the woofer 43 on a Bridged-Tied-Load (BTL) basis. This enables the device to generate stronger sound.

Figure 4:
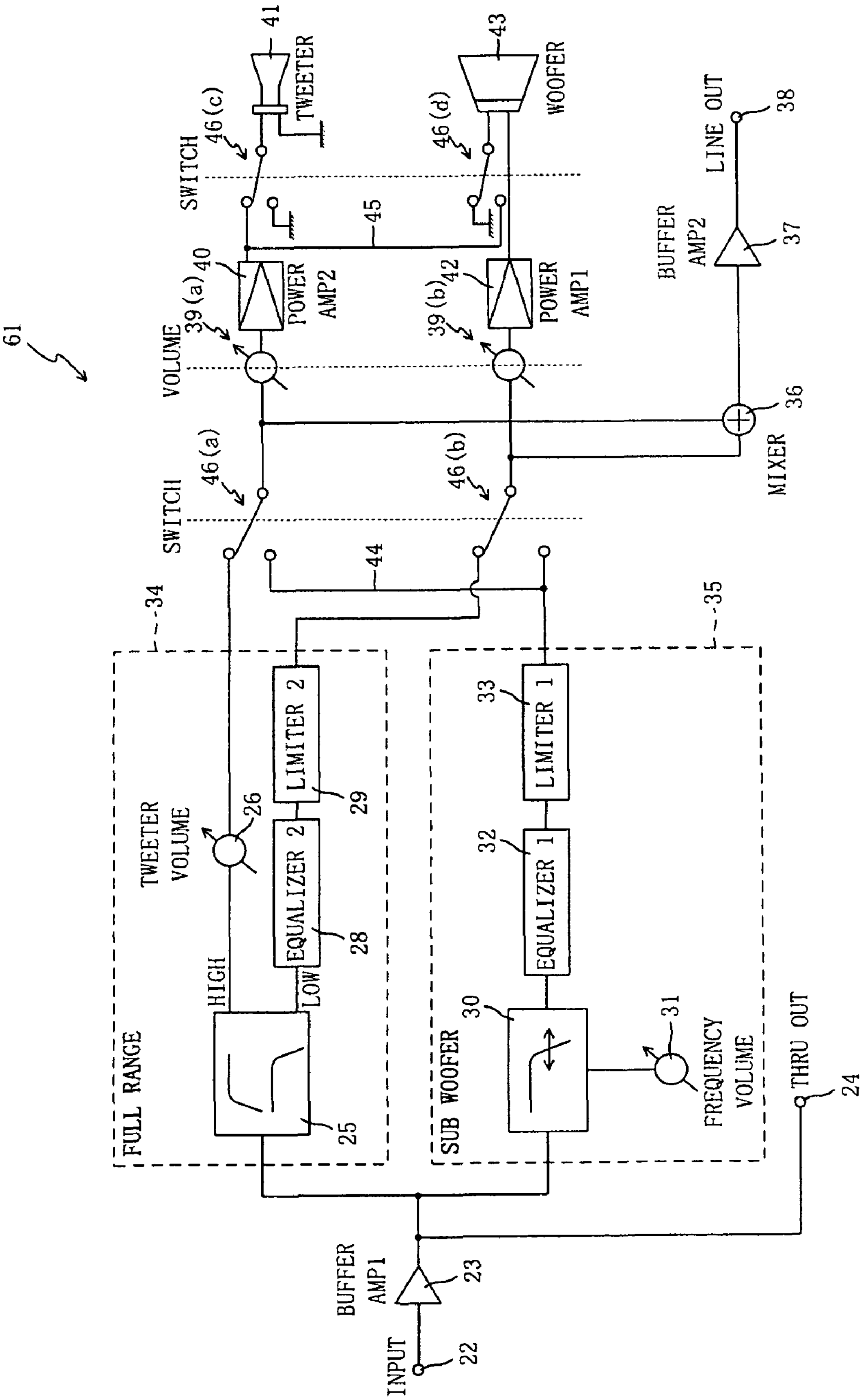
FIG. 4 is a block diagram illustrating an electrical configuration of a sound device according to yet another embodiment of the invention.

FIG. 4 is a block diagram illustrating the electrical configuration of a sound device 61 according to another embodiment of the invention. Like components are referred to with same reference numerals as in FIG. 2 to omit its detailed explanation, and the details of components that are different from the embodiment of FIG. 2 will be described. Referring now to FIG. 4, a sound device 61 comprises a mode switch 46, a signal line 44, and a signal line 45. The mode switch 46 is a switch to operate the woofer 43 on a BTL basis with the primary power amplifier 42 and the secondary power amplifier 40. The mode switch 46 is equipped with four switch points (46*a*, 46*b*, 46*c*, and 46*d*). One motion of the switch changes these four switch points simultaneously; thus, it can switch four independent electrical circuits simultaneously.

The mode switch 46 selects electronic signals that are output from both the sub woofer mode circuit 35 and the full range mode circuit 34, and switches inputs of both the woofer 43 and the tweeter 41 at the same time. One end of the input section of the mode switch 46(*a*) is connected with high frequency range electronic signals that are output from the full range mode circuit 34, and the other end is connected with low frequency range electronic signals that are output from the sub woofer mode circuit 35 via the signal line 44. The mode switch 46(*a*) inputs the selected outputs on the signal mixer 36 and the volume controller 39(*a*). One end of the input section of the mode switch 46(*b*) is connected with low frequency range electronic signals that are output from the full range mode circuit 34, and the other end is connected with low frequency range electronic signals that are output from the sub woofer mode circuit 35. The mode switch 46(*b*) inputs the selected outputs on the signal mixer 36 and the volume controller 39(*b*). One end of the input section of the mode switch 46(*c*) is connected with electronic signals that are amplified with the secondary power amp 40, and the other end is connected with GND. The mode switch 46(*c*) inputs the selected outputs on one end of the tweeter 41. The other end of the tweeter 41 is connected with GND. One end of the input section of the mode switch 46(*d*) is connected with GND, and the other end is connected with electronic signals that are amplified with the secondary power amplifier 40. The mode switch 46(*d*) inputs the selected outputs on one end of the woofer 43. The other end of the woofer 43 is connected with the primary power amplifier 42.

When the mode switch 46 selects the-sub woofer mode, low frequency range electronic signals that are output from the sub woofer mode circuit 35 pass the mode switch 46(*b*), and are input on the signal mixer 36 and the volume controller 39(*b*). Electronic signals that their sound volume controlled by the volume controller 39(*b*) are amplified with the primary power amplifier 42, and are input on one end of the woofer 43.

In the meantime, low frequency range electronic signals that are output from the sub woofer mode circuit 35 pass the mode switch 46(*a*) via the signal line 44, and are input on the signal mixer 36 and the volume controller 39(*a*). Electronic signals that have their sound volume controlled by the volume controller 39(*a*) are amplified in opposite phase with the secondary power amplifier 40. Electronic signals that are amplified by the secondary power amplifier 40 are input on the other end of the woofer 43 via the signal line 45 and the mode switch 46(*d*). As the mode switch 46(*c*) is connected with GND, there are no electronic signal input on the tweeter 41, and the tweeter 41 generates no sound.

In this way, when the device inputs electronic signals that are amplified by the primary power amplifier 42 on one end of input section of a speaker and inputs electronic signals that are amplified in opposite phase by the secondary power amplifier 40 on the other end, the potential difference of electronic signals at both ends of input section that is input and can be two times larger than the normal. Thus, the device can generate stronger sound pressure. This type of speaker operation is referred to as BTL operation type.

On the other hand, when the mode switch 46 selects full range mode, just like the sound device 21 of FIG. 2, low frequency range electronic signals that are output from the full range mode circuit 34 pass the mode switch 46(*b*) and are input on the signal mixer 36 and the volume controller 39(*b*). Electronic signals that are output from the volume controller 39(*b*) are amplified by the primary power amplifier 42, and are input on one end of the input section of the woofer 43. The other end of the input section of the woofer 43 is connected with GND via the mode switch 46(*d*).

High frequency range electronic signals that are output from the full range mode circuit 34 pass the mode switch 46(*a*), and are input on the signal mixer 36 and the volume controller 39(*a*). Electronic signals that are output from the volume controller 39(*a*) are amplified by the secondary power amplifier 40, pass the mode switch 46(*c*), and are input on one end of the input section of the tweeter 41. The other end of the input section of the tweeter 41 is connected with GND.

As described above with reference to FIG. 4, when sub woofer mode is selected, the secondary power amplifier 40, which is not used in the embodiment of FIG. 2, is used to amplify low frequency range electronic signals in opposite phase. The primary power amplifier 42 and the secondary power amplifier 40 amplify low frequency range electronic signals that are output from the sub woofer mode circuit 35 respectively, and co-operate the woofer 43 on a BTL basis. It enables the device to generate stronger sound.

The above is a description of certain embodiments of the invention. The application of the invention, however, should not be limited by the embodiments, and it is easy to assume that various modifications can be applied as long as they will not deviate from the point of the invention.

For example, we described switch movement with mode switch as analog circuit movement in the embodiments. Digital processing can also be applied.

In other embodiments, when sub woofer mode is selected, the cut-off frequency level controller 31 may be used while the tweeter level controller 26 is not. When full range mode is selected, the tweeter level controller 26 may be used while the cut-off frequency level controller 31 is not. The method to use one control terminal as the cut-off frequency level controller 31 during sub woofer mode and as the tweeter level controller 26 during full range mode can also be applied.

In some embodiments, when the sub woofer mode is selected in the sound device 61, low frequency range electronic signals that are output from the sub woofer mode circuit 35 are amplified by the primary power amplifier 42 in normal phase, and are amplified by the secondary power amplifier 40 in opposite phase, in order to co-operate the woofer 43 on a BTL basis. The method to amplify the primary power amplifer 42 as well as the secondary power amplifier 40 in normal phase to co-operate the woofer 43 on a BTL basis.

While particular embodiments of the present invention have been disclosed, it is to be understood that various different modifications and combinations are possible and are contemplated within the true spirit and scope of the appended claims. There is no intention, therefore, of limitations to the exact abstract and disclosure herein presented.

What is claimed is:

1. A sound device, comprising:

an input terminal for electronic signal input;

a sub woofer mode comprising a low pass filter adapted to filter electronic signals input to the input terminal and to output low frequency range electronic signals;

a full range mode comprising a crossover filter adapted to filter electronic signals input on the input terminal, and to output electronic signals with both low frequency range and high frequency range respectively;

a switch arrangement adapted to select between full range mode and sub woofer mode;

a primary power amplifier adapted to amplify (1) low frequency range electronic signals output from the crossover filter when the switch arrangement selects full range mode, and (2) electronic signals output from the low pass filter when the switch arrangement selects sub woofer mode;

a secondary power amplifier adapted to amplify high frequency range electronic signals output from the crossover filter when the switch arrangement selects full range mode;

a woofer adapted to be operated by electronic signals amplified by the primary power amplifier, and;

a tweeter adapted to be operated by electronic signals amplified by the secondary power amplifier.

2. The sound device of claim 1, further comprising:

a level configuration arrangement adapted to configure signal level of high frequency range electronic signals that are output from the crossover filter.

3. The sound device of claim 1, further comprising:

a frequency configuration arrangement adapted to configure cut-off frequency for the low pass filter.

4. The sound device of claim 2, further comprising:

a frequency configuration arrangement adapted to configure cut-off frequency for the low pass filter.

5. A sound device of claim 1, further comprising:

a primary sound quality control arrangement adapted to control electronic signals output from the low pass filter, and to change sound quality properties; and a secondary sound quality control arrangement adapted to control electronic signals output from the crossover filter, and to change sound quality properties.

6. The sound device of claim 4, further comprising:

a control terminal adapted to conduct the configuration operation of (1) the level configuration when the switch arrangement selects full range mode, and (2) the frequency configuration when the switch arrangement selects sub woofer mode.

7. The sound device of claim 1, further comprising:

an alert arrangement adapted to alert a particular mode that the switch arrangement selects.

8. The sound device of claim 7, further comprising:

an LED adapted to alert the report.

9. The sound device of claim 1, further comprising:

a power shut-off arrangement adapted to cut off power supply for the secondary power amplifier when the switch arrangement selects sub woofer mode.

10. The sound device of claim 1, wherein:

the secondary power amplifier amplifies electronic signals output from the low pass filter and operates the woofer along with the primary power amplifier when the switch arrangement selects sub woofer mode.

11. The sound device of claim 10, wherein:

the primary power amplifier and the secondary amplifier operate the woofer based on BTL operation.

12. The sound device of claim 1, further comprising:

a through output terminal adapted to output electronic signals input on the input terminal to an external area.

13. The sound device of claim 1, further comprising:

a line output terminal adapted to output (1) electronic signals input on the input terminal over the entire frequency range when the switch arrangement selects full range mode, and (2) electronic signals filtered through the low pass filter when the switch arrangement selects sub woofer mode.

14. A sound device, comprising:

a full range mode circuit adapted to output electronic signals;

a sub woofer mode circuit adapted to output electronic signals below a cut-off frequency;

a switch arrangement adapted to select between full range mode circuit and sub woofer mode circuit; and at least one power amplifier adapted to amplify electronic signals output by the mode circuit selected by the switch arrangement;

wherein the full range mode circuit includes a cross-over filter adapted to output low frequency range signals on a first output and high frequency range signals on a second output;

wherein the at least one power amplifier includes a first power amplifier adapted to operate a woofer and a second power amplifier adapted to operate a tweeter; and wherein the switching arrangement is adapted to:

(1) when the sub woofer mode circuit is selected, direct the electronic signals to the first power amplifier adapted to operate a woofer; and (2) when the full range mode circuit is selected, direct the low frequency range signals to the first power amplifier adapted to operate a woofer and direct the high frequency range signals to the second power amplifier adapted to operate a tweeter.

15. The sound device of claim 14, wherein the second power amplifier has a first output adapted to operate a tweeter and a second output adapted to operate a woofer;

wherein the switching arrangement is adapted to select between the first output and the second output of the second power amplifier; and wherein the switching arrangement is further adapted to, when the sub woofer mode circuit is selected, direct electronic signals from the sub woofer mode circuit through both the first power amplifier and the second power amplifier to operate a woofer.

* * * * *